Figure 1:
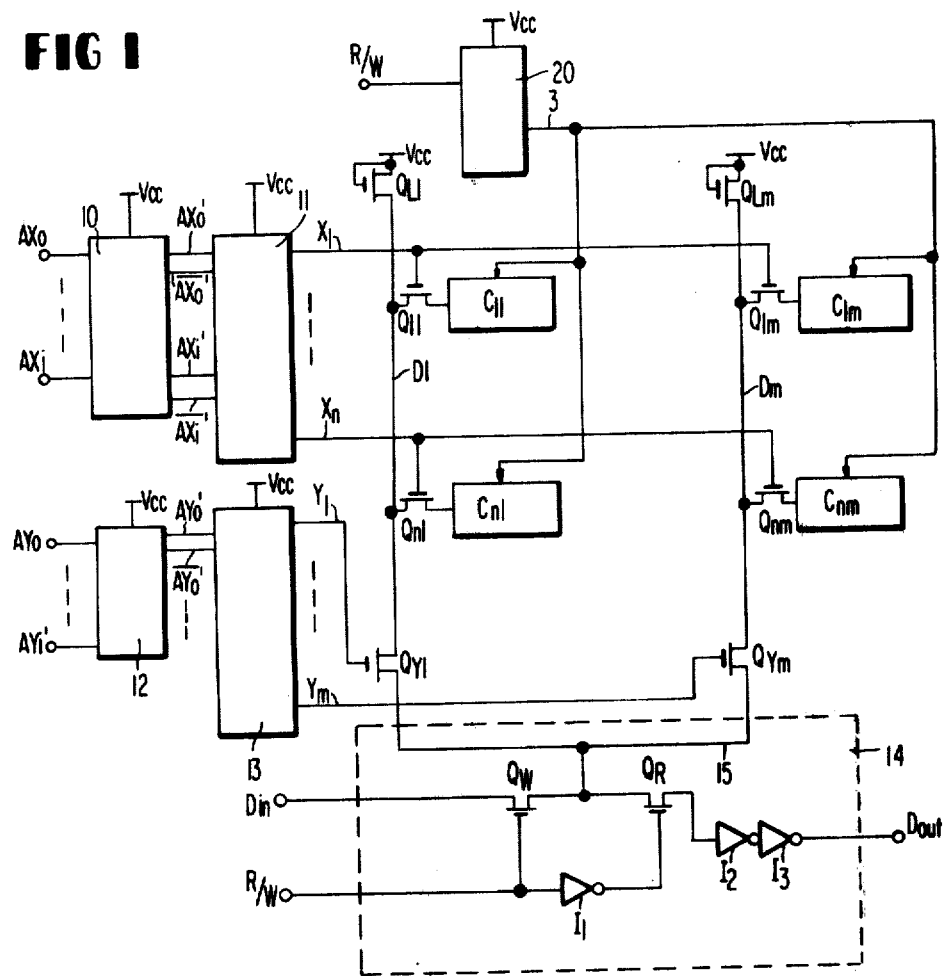

United States Patent [19]

Tsujide

[11] 4,310,900
[45] Jan. 12, 1982

[54] MEMORY DEVICE WITH DIFFERENT READ AND WRITE POWER LEVELS

[75] Inventor: Tohru Tsujide, Tokyo, Japan

[73] Assignee: Nippon Electric Co., Ltd., Tokyo, Japan

[21] Appl. No.: 92,304

[22] Filed: Nov. 8, 1979

[30] Foreign Application Priority Data

Nov. 8, 1978 [JP] Japan .................. 53-137487

[51] Int. Cl.³ .................. G11C 7/00; G11C 11/40
[52] U.S. Cl. .................. 365/190; 365/226
[58] Field of Search .................. 365/154, 190, 226

[56] References Cited

U.S. PATENT DOCUMENTS 3,510,849  5/1970  Igarashi .................. 365/190
4,156,940  5/1979  Hollingsworth et al. .................. 365/190

OTHER PUBLICATIONS

Haug et al., "Single Emitter Pinch Resistor Cell," IBM Tech. Disc. Bul., vol. 13, No. 2, 7/70, pp. 475–476.
McDowell, "Bilevel Power Storage Cell," IBM Tech. Disc. Bul., vol. 14, No. 6, 11/71.

*Primary Examiner*—Stuart N. Hecker
*Attorney, Agent, or Firm*—Sughrue, Mion, Zinn, Macpeak and Seas

[57] ABSTRACT

A memory device in which an information can be easily written without failure is disclosed. The memory device comprises means for supplying a memory cells with a first voltage as a power supply thereto when a read operation is performed and means for supplying at least selected one of the memory cells with a second voltage which is smaller than the first voltage in absolute value.

15 Claims, 8 Drawing Figures

MEMORY DEVICE WITH DIFFERENT READ AND WRITE POWER LEVELS

The present invention relates to a memory device, and more particularly to a semiconductor memory device fabricated in the form of an integrated circuit.

In recent years, the memory capacity of semiconductor memory devices have progressively increased and it is a pressing need to reduce a size of a unit circuit for memory storage (hereinafter referred to as "memory cell"). Heretofore, a memory cell in a static type semiconductor memory device has been formed of six elements consisting of two load elements of either depletion type transistors or resistors, two cross-coupled transistors forming a flip-flop and two transfer-gate transistors, requiring, when fabricated as a semiconductor integrated circuit, many apertures and wirings surrounding the peripheries of the apertures with a certain margin for connecting the respective elements to each other. The aforementioned wirings include a pair of information lines i.e. digit lines respectively connected to the above-mentioned two transfer-gates per one column of memory cells. Consequently, the apertures and wirings have limited the reduction of the memory cell area.

On the other hand, a 5-element memory cell, in which one of the transfer-gate transistors is removed, has been reported. This modification remarkably contributes to the reduction of the memory cell area, because in addition to omission of the area of one transistor, a digit line generally formed of an aluminum (Al) wiring and an aperture for connecting this digit line to the transistor become unnecessary. However, in such a 5-element memory cell, it is necessary to achieve writing to the cell through only a single digit line. In general, a memory cell should be directly supplied with a power supply voltage of, for example, 5 V that is identical to that applied to a peripheral circuit, and hence it is very difficult to write inverse information into the memory cell i.e. to reverse the logical state of the memory cell, because the voltage supplied to the gate of an off-state of transistor of the memory cell by the inversion of the information cannot become sufficiently higher than the voltage at the drain of the same transistor. On the other hand, in the case where a voltage lower than a power supply voltage of, for example 5 V, is supplied to all the memory cells, the memory cell cannot output a sufficient level difference, and hence reading becomes difficult.

One object of the present invention is to provide a memory device in which write operations can be achieved easily.

Another object of the present invention is to provide a semiconductor memory device fabricated with a high density of integration.

A memory device according to the present invention is characterized by means for switching at least the power supply voltage applied to selected memory cells upon writing to a voltage value that is smaller in absolute value than that upon reading.

According to the invention, there is provided an integrated circuit memory device comprising a plurality of word lines, a plurality of digit lines intersecting with the word lines, a plurality of memory cells disposed at respective intersections of the word lines and the digit lines, each of the memory cells including a flip-flop circuit having a pair of cross-coupled points, a first power terminal and a second power terminal and a transfer gate coupled between one of the pair of cross-coupled points and an associated one of the digit lines and controlled by an associated one of the word lines, means for selecting one of the word lines, first supply means for supplying the first power terminal with a first voltage, second supply means for providing the second power terminals with a second voltage different from the first voltage during a read operation, and means for providing at least selected ones of the memory cells with a third voltage during a write operation, the third voltage being within a range between the first voltage and the second voltage.

The flip-flop circuits may include first and second insulated-gate field-effect transistors having gates and drains cross-coupled at the pair of cross-coupled points. Further, the transfer gate may be formed of a third insulated-gate field-effect transistor having a gate coupled to the associated one of the word lines, a drain coupled to the associated one of the digit lines and a source coupled to the one of the pair of cross-coupled points.

Furthermore, it is favorable in the above circuit that the third voltage is higher than the first voltage by at least the threshold voltage of either of the first and second insulated-gate field-effect transistors in absolute value and is lower than the second voltage by at least the threshold voltage of the third insulated-gate field-effect transistor.

In the above described circuit, the second supply means may be composed of an inverter circuit operable with the first and the second voltage having a write signal at its input.

Figure 2:
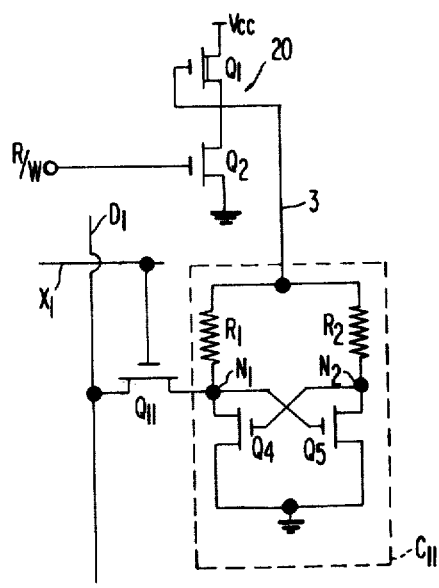
Figure 3:
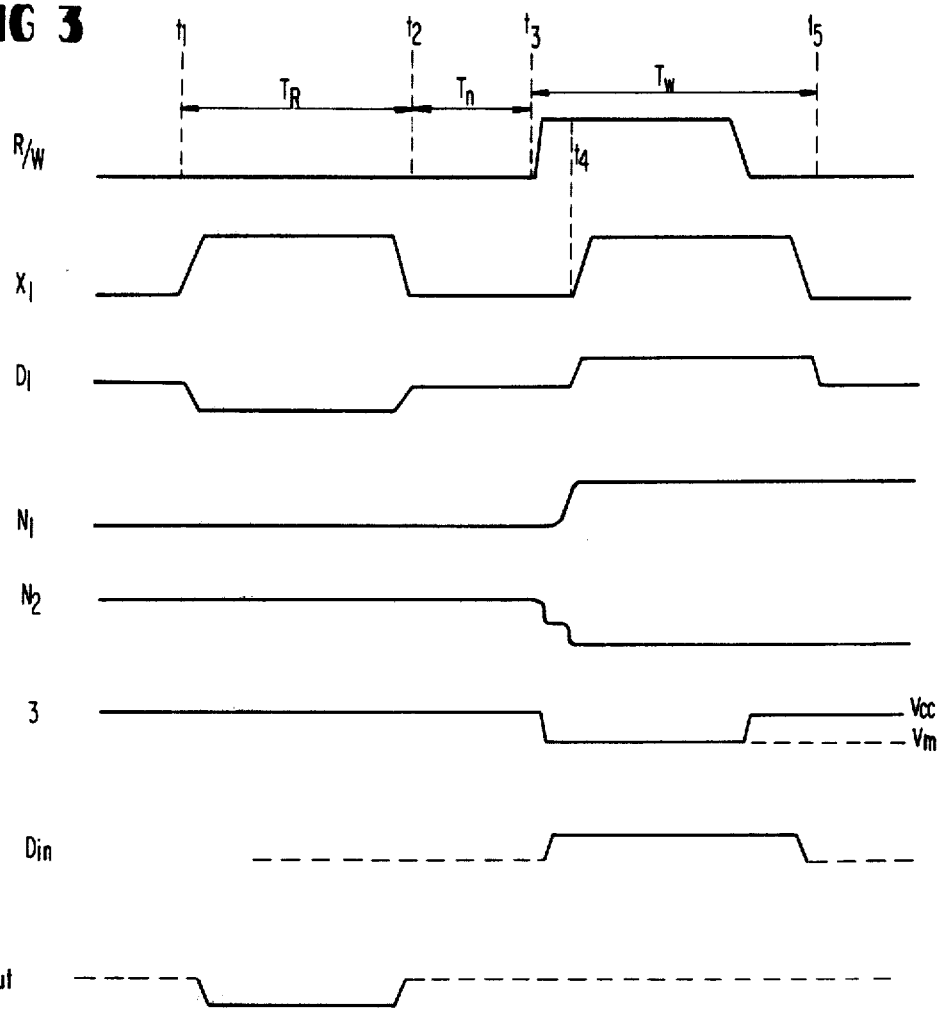
Figure 4:
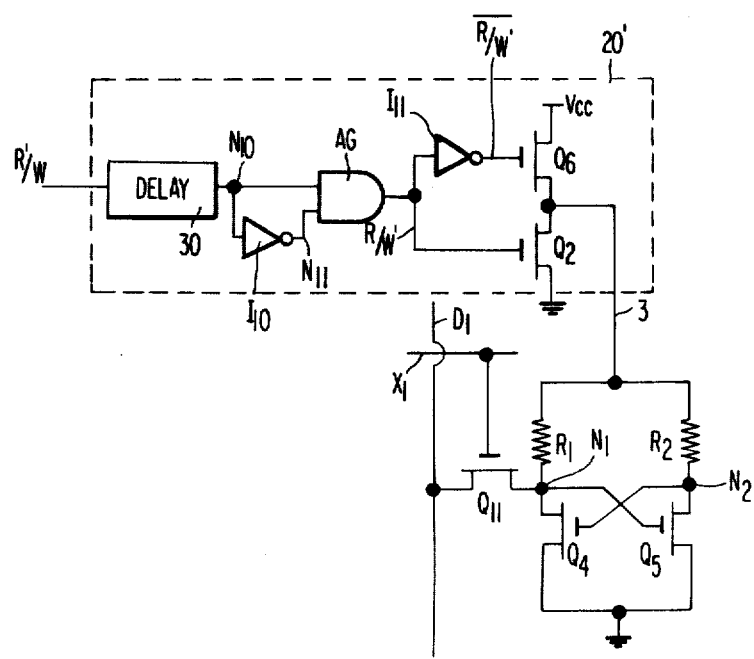
Figure 5:
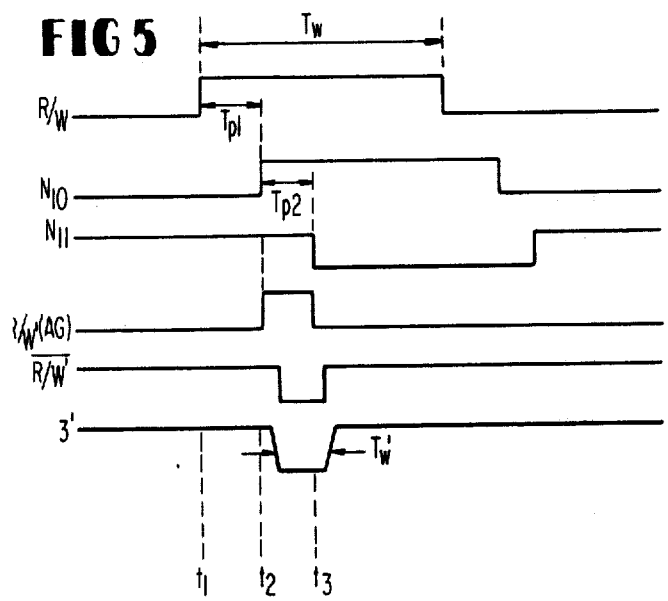
Figure 6:
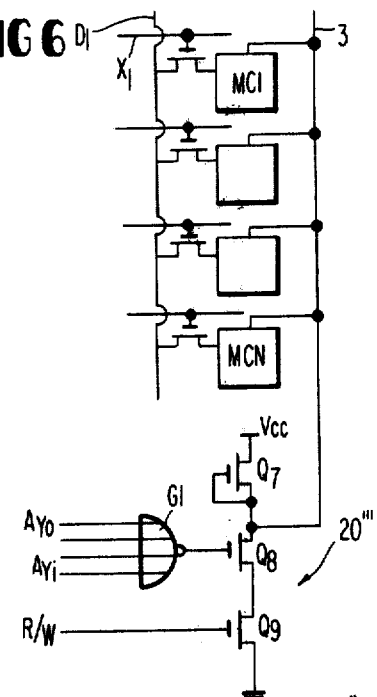
Figure 7:
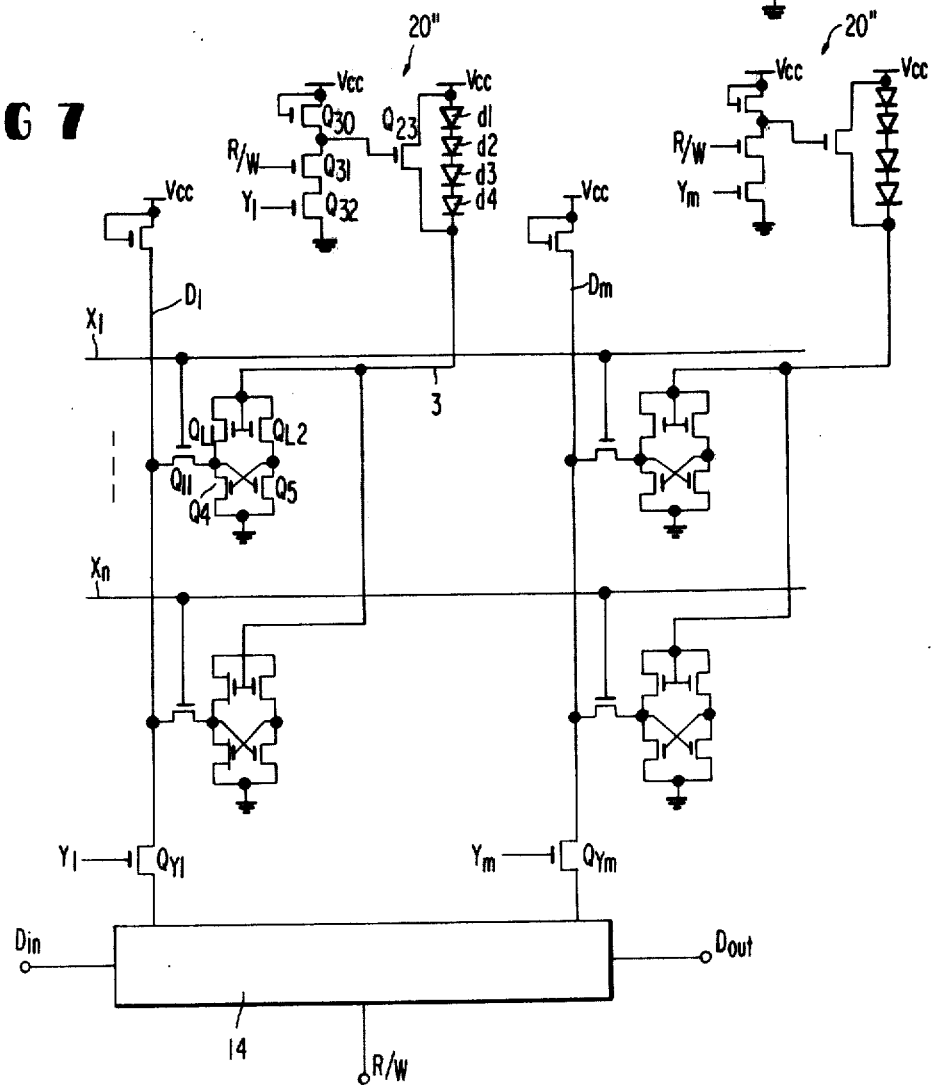
Figure 8:
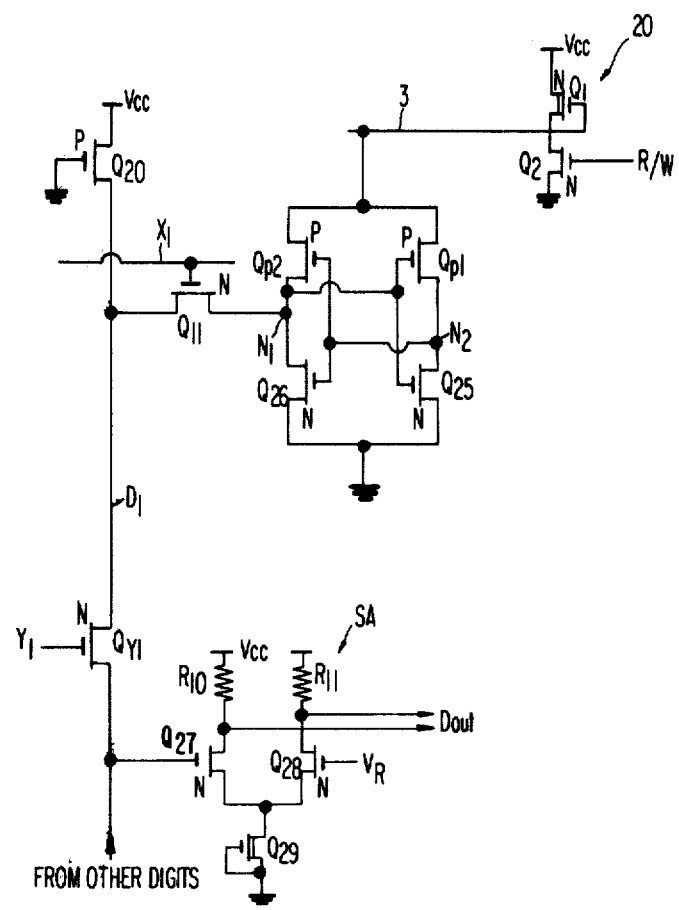

The above-mentioned and other features and objects of the present invention will become more apparent by reference to the following description of its preferred embodiments taken in conjunction with the accompanying drawings, wherein:

FIG. 1 is a block diagram showing a memory system according to a first preferred embodiment of the present invention, FIG. 2 is a circuit diagram showing the details of a memory cell and a power supply circuit in the memory system shown in FIG. 1, FIG. 3 is a waveform diagram showing operating waveforms at various points in the memory system shown in FIGS. 1 and 2, FIG. 4 is a circuit diagram showing the details of the memory cell and the power supply circuit according to a second preferred embodiment of the present invention, FIG. 5 is a waveform diagram showing the operation of the voltage control circuit in FIG. 4, FIG. 6 is a circuit diagram showing the details of the memory cell and the power supply circuit according to a third preferred embodiment of the present invention, FIG. 7 is a block diagram showing a memory system according to a fourth preferred embodiment of the present invention, and FIG. 8 is a block diagram showing the major part of the memory according to a fifth embodiment of the present invention.

Now one preferred embodiment of the memory system according to the present invention will be described with reference to FIG. 1. In this preferred embodiment, by way of example, the memory system is assumed to be an asynchronous static RAM. X-address signals $AX_0, \ldots AX_i$ are input to an X-address buffer 10, in which their respective true and complementary address signals $AX'_o, \overline{AX'_o}, \ldots, AX'_i$ and $\overline{AX'_i}$ are generated. These true and complementary address signals are fed to an X-address decoder 11. The X-address decoder 11 responds to the true and complementary X-address signals and selects one of a plurality of word lines $X_1, \ldots, X_n$ to make the selected word line active in level. While, Y-address signals $AY_o, \ldots AY_i$ are fed to a Y-address buffer 12, in which true and complementary Y-address signals $AY'_o, \overline{AY'_o}, \ldots, AY'_i$ and $\overline{AY'_i}$ are generated from the respective Y-address signals $AY_o, \ldots AY_i$. These true and complementary Y-address signals are input to a Y-address decoder 13. The Y-address decoder 13 responds to the true and complementary Y-address signals and selects one of a plurality of digit selection outputs $Y_l, \ldots, Y_m$ to make the selected output active in level.

There are provided digit lines $D_l, \ldots, D_m$ intersecting with the word lines $X_l, \ldots, X_n$, and at the respective crosspoints between the digit lines and the word lines are disposed flip-flop type memory cells $C_{ll}, \ldots, C_{lm}, \ldots, C_{nl}, \ldots, C_{nm}$ which are connected to the corresponding digit lines and word lines via transistors serving as transfer gates $Q_{11}, \ldots, Q_{lm}, \ldots, Q_{nl}, \ldots, Q_{nm}$, respectively. It is to be noted that a transfer gate transistor is provided individually for each memory cell, and hence it can be deemed to be a part of a memory cell. However, in this section of the specification the transfer gate transistor is described as a item separate from the memory cell. It should be noted that this is no more than a matter of mere terminology. The respective digit lines $D_1, \ldots, D_m$ are biased from a power supply $V_{cc}$ through load transistors $Q_{Ll}, \ldots, Q_{Lm}$, respectively. Also the respective digit lines $D_l, \ldots, D_m$ are coupled to an input/output circuit 14 via Y-select transistors $QY_l, \ldots, QY_m$, respectively.

The input/output cicuit 14 comprises a write control transistor $Q_W$ connected between a common data line 15 and a data input terminal $D_{in}$ and having a read/write control signal R/W applied to its gate, a read control transistor $Q_R$ having its drain connected to the common data line 15 and having a signal produced by inverting the read/write control signal R/W through an inverter $I_1$ applied to its gate, an inverter $I_2$ having its input connected to the source of the read control transistor $Q_R$, and an inverter $I_3$ whose input is connected to the output of the inverter $I_2$. In this input/output circuit 14, the series connection of the inverters $I_2$ and $I_3$ functions as an output amplifier. It is to be noted that as a matter of course the output amplifier could be constructed in a different manner from the illustrated series connection of the inverters $I_2$ and $I_3$. All of the circuits and inverters except the memory cells are supplied with a power supply voltage $V_{cc}$.

In the illustrated memory system according to the present invention, a voltage control circuit 20 for all the memory cells is fed with the power supply $V_{cc}$, and the output voltage on its power supply output line 3 is controlled by the read/write control signal R/W applied thereto in such manner that upon reading or holding when the signal R/W is at "0" level, approximately the power supply voltage $V_{cc}$ is generated on the output line 3, whereas upon writing when the signal R/W is at "1" level, a voltage at a level $V_M$ that is lower than the level $V_{cc}$ and higher than another power supply voltage e.g. ground potential is generated on the output line 3.

Now the details of one of the memory cells $C_{ll}$ and the voltage control circuit 20 in the memory system illustrated in FIG. 1 will be described with reference to FIG. 2. Referring to FIG. 2, each crosspoint in the memory system according to the first preferred embodiment of the present invention comprises five elements consisting of load resistors $R_1$ and $R_2$, flip-flop (cross-coupled) transistors $Q_4$ and $Q_5$, and a transfer-gate transistor $Q_{11}$, and a digit line $D_l$ and a word line $X_l$ both connected to the transfer-gate transistor $Q_{11}$. In the prior art, the power supply voltage $V_{cc}$ was directly fed to the power supply output line 3. However, according to the present invention, the output of a ratio type inverter consisting of a series connection of a depletion transistor $Q_1$ and an enhancement transistor $Q_2$ is fed to the power supply output line 3 as a power supply voltage only for the memory cells. To the gate of the transistor $Q_2$ is applied the read/write control signal R/W. By employing the above-described construction, upon writing, the power supply voltage for the memory cells can be lowered since the control signal R/W takes a high potential, and thus the information stored in the memory cell in which, for example, the transistor $Q_4$ is in an ON state (assumed to be information "0") can be easily reversed to "1" by merely bringing the potential on the digit line $D_l$ to the $V_{cc}$ level, because at that time the drain of the transistor $Q_5$ connected to the resistor $R_2$ has a far smaller potential value than the potential $V_{cc}$. In this case, a sufficient effect can be achived, provided that the control signal R/W makes the transistor $Q_2$ conducting even during a part of the period when write data are applied through the transistor $Q_{11}$ and similar transfer-gate transistors to make the potential on the power supply output line 3 smaller than than the potential $V_{cc}$. In this respect, the lower limit of the value of the level $V_M$ is favorably a voltage higher than the grund potential, by the threshold voltage of either of the cross-coupled transistors $Q_4$ and $Q_5$ of the memory cell, in view of the holding information of unselected memory cells. While, the upper limit of the value of the level $V_M$ is favorably a voltage lower than the power supply voltage $V_{cc}$, by a threshold voltage of the transistor $Q_{11}$, in view of effectively making the level of the node $N_2$ of the high level lower than the level fed to the node $N_1$.

Now a description will be made of the operation of the memory system illustrated in FIGS. 1 and 2, with reference to FIG. 3. The period $T_R$ extending from time $t_1$ to time $t_2$ is a period for read-out operation. A read/write control signal R/W is at a lower level during the period other than the write period, that is, during the read period and the hold period, but it assumes a high level during the write period. At time $t_1$, due to the read-out operation, the control signal R/W is at a lower level. At time $t_1$ the level of the word line $X_l$ changes to a high level to make the transfer-gate transistor $Q_{11}$ conducting, and thereby a node $N_1$ in the flip-flop in the memory cell and the digit line $D_l$ are coupled to each other. Assuming that at this moment the memory cell $C_{ll}$ stores information "0", that is, the transistor $Q_4$ is ON, while the transistor $Q_5$ is OFF, then the digit line $D_l$ will shift approximately to the level ("0" level) of the node $N_1$, and this information "0" is derived from the data output terminal $D_{out}$. This state is maintained during the period when the word line $X_l$ is held at a high level, that is, up to time $t_2$. A period $T_h$ extending from $t_2$ to time $t_3$ is a hold period for holding stored information upon non-access. During the non-write period extending up to time $t_3$, in response to the lower level of the read/write control signal R/W, the voltage control circuit 20 feeds via the power supply output line 3 a voltage approximately equal to the power supply voltage $V_{cc}$. Therefore, the output of the memory cell, that is, the potential difference between the nodes $N_1$ and $N_2$ can be given a sufficiently large amplitude, and thus the read and hold operations can be achieved in a stable manner.

Subsequently, at time $t_3$ the operation enters a write period $T_W$, when the control signal R/W takes a high level and hence the voltage control circuit 20 feeds via its output line 3 a potential at an intermediate level $V_M$ that is lower than the power supply potential $V_{cc}$. Consequently, the potential at the node $N_2$ which has been held at the high level in the memory cell $C_{II}$, is lowered from the potential approximately equal to $V_{cc}$ to a potential approximately equal to $V_M$. At time $t_4$, the world line $X_l$ assumes a high level, and thereby the node $N_1$ in the memory cell $C_{II}$ and the digit line $D_l$ are coupled to each other via the transfer-gate transistor $Q_{11}$. Owing to this coupling between the digit line $D_l$ and the memory Cell $C_{II}$, the write signal at the level "1" applied to the data input terminal $D_{in}$ can be transferred to the node $N_1$. At this moment, the potential applied to the node $N_1$ is at a high level approximately equal to the $V_{cc}$ level, and since this level is higher than the level $(V_M)$ at the node $N_2$, the information stored in the memory cell $C_{II}$ can be quickly and easily changed from "0" to "1" to achieve the write-in operation of the information.

A second preferred embodiment of the present invention differs from the first preferred embodiment illustrated in FIGS. 1 and 2 only in the details of the voltage control circuit, and the modified voltage control circuit 20' is shown jointly with one cross-point section in FIG. 4. In the voltage control circuit 20', the level of the line 3 during the write operation is made a ground potential, which is different from the provision of the preceding embodiment. However, if such a level is directly applied to the line 3 during a whole write period, information stored in unaccessed memory cells to which the line 3 is coupled would be destroyed. Therefore, the time period in which the level of the line 3 is made low (ground potential) is shortened so as to maintain the states of other memory cells by keeping one of the transistors $Q_4$ and $Q_5$ of the other memory cells by charges at one of nodes $N_1$ and $N_2$. In this case, the low level time period is set shorter than a period corresponding to a time constant determined by a resistance of the resistor $R_1$ and $R_2$ and the capacitance of the nodes $N_1$ and $N_2$. For achieving this relation, the control signal R/W is shortened by a delay circuit 30 having a delay time $T_{p1}$, an inverter circuit $I_{10}$ having a delay time $T_{p2}$ and an AND gate AG to be supplied to a gate of a transistor $Q_2$. An inverted signal $\overline{R/W'}$ of the signal R/W' obtained by an inverter $I_{11}$ is supplied to a gate of a transistor $Q_6$ so that an inverter consisting of the transistors $Q_6$ and $Q_2$ is controlled in a push-pull manner. The operation of the voltage circuit 20' is shown in FIG. 5. At a time $t_1$, the control signal R/W is raised to a high level $(V_{cc})$ to designate a write operation period $T_W$ as a whole system. Then at a time point $t_2$, later than time $t_1$ by the period $T_{p2}$ corresponding to the delay time of the delay circuit 30, an output of the delay circuit 30 at a node $N_{10}$ is raised to the high level. Until a time point $t_3$, later than time point $t_2$ by the period $T_{p2}$ corresponding to the delay time of the inverter $I_{10}$, an output $N_{11}$ of the inverter $I_{10}$ takes the high level and then from the time point $t_3$, it is made a low (ground) level. During the period $(T_{p2})$ from $t_2$ to $t_3$, both of the levels at the nodes $N_{10}$ and $N_{11}$ are high so that the output of the AND gate AG as the signal R/W' is made high to make the level of the line 3 low (ground). Thus, the write operation is performed during the period $(T_{p2})$ from the time $t_2$ to the time $t_3$. In this embodiment, as previously described, the period $T_{p2}$ is required to be set shorter than the time constant at the nodes $N_1$ or $N_2$ determined by the capacitance of the node $N_1$ or $N_2$ and the resistance of the resistor $R_1$ or $R_2$. Therefore, it is favorable to make the value of the resistance of the resistors $R_1$ and $R_2$ relatively large. If depletion type type transistors or enhancement type transistors are used as load elements in place of resistors, their conducting resistances are considered to determine the time constant as well.

With reference to FIG. 6, a third embodiment of the present invention will be described. In this embodiment, a voltage control circuit 20''' and a power supply output line 3 are provided for feeding only a plurality of memory cells MC1, . . . , MCN associated with a given digit line $D_l$. Other digit lines (not shown) are similarly provided with such voltage control circuits and output lines. An inverter is formed of a transistor $Q_8$ which receives the output of a NOR-gate G1 as an unit of the decoder receiving the amplified Y-address signals $AY'_o$, . . . , $AY'_i$ to be used for digit line selection, a transistor $Q_9$ having the control signal R/W applied to its gate, and a load transistor $Q_7$. The output of this inverter is fed to the power supply output lines 3. According to the above-described construction of the voltage control circuit 20''', upon writing, a relatively low power supply voltage $(V_M)$, the value of which is dependent on the conductance ratio of the transistors $Q_7$ to $Q_9$, is fed only to the memory cells associated with the selected memory cell. In this case, the power supply voltage necessitated for the unselected memory cells is kept sufficiently high to hold information. The above-described third preferred embodiment has been worked out as a measure for eliminating the short-coming that, generally, power supply lines for a plurality of memory cells are connected in common along the respective word lines or along the respective digit lines, and there is fear that information stored in the unselected memory cells associated with the unselected word line might be destroyed due to the low power supply voltage.

Now a fourth preferred embodiment of the present invention will be described with reference to FIG. 7. In this preferred embodiment, each memory cell is formed of cross-coupled transistors $Q_4$ and $Q_5$ and load transistors $Q_{L1}$ and $Q_{L2}$. The gate of the transistor $Q_5$ is coupled to a digit line $D_1$ via a transfer-gate transistor $Q_{11}$. According to this fourth preferred embodiment, a voltage control circuit 20'' is provided individually for each digit line, so that the output voltage to be fed to the respective cells associated with the same digit line may be switched from the power supply voltage $V_{cc}$ to the intermediate level $V_M$ only when the associated digit line has been selected and when a write operation is achieved. In the voltage control circuit 20'', transistors $Q_{30}$ to $Q_{32}$ form a NAND circuit, in whch the transistor $Q_{30}$ is used as a load transistor, the transistor $Q_{31}$ has a read/write control signal R/W applied to its gate, and the transistor $Q_{32}$ has a Y selection signal $Y_1$ applied to its gate. Therefore, only when both the signals R/W and $Y_1$ take higher levels, the transistor $Q_{33}$ is turned OFF, so that a voltage shifted by four serially connected diodes $d_1$ . . . $d_4$, that is, a voltage of $V_{cc}$-4$V_F$ ($V_F$ being the forward voltage of the diode) is fed to the power supply output line 3. It is to be noted that the number of diodes should be selected arbitrarily depending upon the voltage to be shifted. This shifted voltage $V_{cc}-4V_F$ is utilized as a power supply voltage for each memory cell upon writing. On the other hand, when a write operation to a predetermined digit position is not effected, at least one of the control signal R/W and the Y-selection signal $Y_1$ is held at "0" level, so that the transistor $Q_{33}$ is conducting, and thus a voltage approximately equal to the power supply voltage $V_{cc}$ is fed to the power supply output line 3.

With reference to FIG. 8, a fifth embodiment of the present invention will be described. In this embodiment, a memory cell is composed of N channel enhancement transistors cross-coupled at nodes $N_1$ and $N_2$ and P channel enhancement transistors $Q_{P1}$ and $Q_{P2}$. The memory cell has a C-MOS structure and hence no constant current path occurs therein. A sense amplifier SA including load resistors $R_{10}$ and $R_{11}$, N channel enhancement transistors $Q_{27}$ and $Q_{28}$ and an N channel depletion transistor as a constant current source operates as a known differential amplifier to produce a pair of outputs ($D_{out}$), in which the gate of the transistor $Q_{28}$ is supplied with a reference voltage $V_R$. The remaining portions, such as the voltage control circuit 20, are similar to those of the preceeding embodiments.

I claim:

1. A memory device comprising a plurality of word lines, a plurality of digit lines, and a plurality of memory means, each of said memory means including a word terminal connected to an associated one of said word lines, a data terminal connected to an associated one of said digit lines, and a power voltage terminal for receiving a power voltage for said memory means, means for supplying said power supply terminals of said memory means with a first voltage when a read operation is formed, and means for supplying said power supply terminal of at least a selected one of said memory means with a second voltage when a write operation is performed, said second voltage being smaller than said first voltage in absolute value and being capable of maintaining the information of the memery cell.

2. The memory according to claim 1, wherein said memory means includes a bi-stable circuit having an input point and gating means coupled between said input point and said data terminal and a control point connected to said word terminal.

3. The memory according to claim 2, further including means for providing information to be stored in said selected memory means with said associated one of said digit lines.

4. The memory according to claim 3, wherein said supplying means are provided for each of said digit lines.

5. An integrated circuit comprising a plurality of word lines, a plurality of digit lines intersecting with said word lines, a plurality of memory cells disposed at respective intersections of said word lines and said digit lines, each of said memory cells including a flip-flop circuit having a pair of cross-coupled points, a first power terminal and a second power terminal and a transfer gate coupled between one of said pair of cross-coupled points and an associated one of said digit lines and controlled by an associated one of said word lines, means for selecting one of said word lines, first supply means for supplying said first power terminal with a first voltage, second supply means for providing said second power terminals with a second voltage different from said first voltage during a read operation and means for providing at least a selected one of said memory cells with a third voltage during a write operation, said third voltage being within a range between said first voltage and said second voltage.

6. The circuit according to claim 5, in which said flip-flop circuit includes first and second insulated-gate field-effect transistors having gates and drains cross-coupled at said pair of cross-coupled points.

7. The circuit according to claim 6, wherein said transfer gate is formed of a third insulated-gate field-effect transistor having a gate coupled to said associated one of said word lines, a drain coupled to said associated one of said digit lines and a source coupled to said one of said pair of cross-coupled points.

8. The circuit according to claim 7, wherein said third voltage is higher than said first voltage by at least a threshold voltage of either of said first and second insulated-gate field-effect transistors in absolute value.

9. The circuit according to claim 8, wherein said third voltage is lower than said second voltage by at least a threshold voltage of said third insulated-gate field-effect transistor.

10. The circuit according to claim 8, wherein said second supply means includes an inverter circuit operable with said first and said second voltage having a write signal at its input.

11. A semiconductor memory device comprising a plurality of word lines, a plurality of digit lines, and a plurality of memory cells, each of said memory cells including a bistable circuit and a power supply terminal, means for receiving a write signal for designating a write operation, a first voltage source for producing a first voltage, a second voltage source for producing a second voltage, said second voltage being smaller than said first voltage in absolute value, said second voltage being capable of maintaining the state of said bistable circuit, first supply means for supplying said power supply terminals of said memory cells with said first voltage when said write signal is absent, and second supply means for supplying said power supply terminal of at least a selected one of the memory cells with said second voltage when said write signal is present.

12. The device according to claim 11, in which said bistable circuit includes first and second insulated gate field-effect transistors having cross-coupled gates and drains.

13. The device according to claim 11, in which said first voltage source includes a terminal for receiving said first voltage from an outside source.

14. The device according to claim 13, in which said second voltage source includes a voltage shift circuit for shifting said first voltage to said second voltage.

15. The device according to claim 11, further comprising a plurality of transfer means coupled to said memory cells, said transfer means being responsive to an associated one of said word lines for operatively transferring the state of an associated one of said memory cells to an associated one of said digit lines.

* * * * *